United States Patent [19]
Tonari

[11] 3,780,594
[45] Dec. 25, 1973

[54] UHF TUNING MECHANISM

[75] Inventor: Hirohiko Tonari, Kyoto, Japan

[73] Assignee: Matsushita Electric Industrial Co., Ltd., Osaka, Japan

[22] Filed: June 15, 1972

[21] Appl. No.: 263,278

[30] Foreign Application Priority Data

| | | |
|---|---|---|
| June 18, 1971 | Japan | 46/44390 |
| June 18, 1971 | Japan | 46/44391 |
| June 18, 1971 | Japan | 46/44392 |
| June 18, 1971 | Japan | 46/44393 |

[52] U.S. Cl. ................ 74/10.52, 74/10.54, 74/10.41
[51] Int. Cl. ........................................ F16h 35/18
[58] Field of Search ...................... 74/10.41, 10.52, 74/10.54, 10.8

[56] References Cited

UNITED STATES PATENTS

| | | | |
|---|---|---|---|
| 1,503,553 | 8/1924 | Powell | 74/10.54 |
| 3,618,405 | 11/1971 | Ishida | 74/10.52 |
| 3,618,406 | 11/1971 | Mohri et al. | 74/10.52 |

FOREIGN PATENTS OR APPLICATIONS

| | | | |
|---|---|---|---|
| 617,458 | 2/1927 | France | 74/10.52 |
| 636,638 | 4/1928 | France | 74/10.54 |

*Primary Examiner*—Allan D. Hermann
*Attorney*—E. F. Wenderoth et al.

[57] ABSTRACT

A tuning mechanism for a UHF tuner of the type which has a tuner control shaft adjustable to tune the UHF tuner. The mechanism has a tuning shaft which is rotatable in step-by-step rotation under control of a detent means, and driving gear means are mounted on the tuning shaft coupled to driven gear means on the tuner control shaft through a pair of planetary gear means. The planetary gear means are rotatably mounted on a swinging lever which rotates around the tuning shaft under the control of a fine tuning shaft coaxially mounted on the tuning shaft while the tuning shaft is locked in any one of its stop positions by the detent means for fine tuning of the UHF tuner.

6 Claims, 4 Drawing Figures

UHF TUNING MECHANISM

BACKGROUND OF THE INVENTION

The present invention relates to tuning mechanisms for a UHF tuner, and more particularly to a detent type tuning mechanism for a UHF tuner having a tuning shaft rotatable stept-by stept under the control of detent means.

The tuning frequency of a common detent type UHF tuner is adjustable in proportion to the angle of rotation of a tuner control shaft. This tuner control shaft can be rotated step-by-step at an angle corresponding to one channel in the UHF band by a tuning shaft under the control of a detent means, and can be rotated finely and continuously by a fine tuning shaft so as to compensate for a fluctuating frequency which is caused by the change in voltage of a power supply or the ambient temperature. Therefore, it is necessary for such a tuning mechanism to provide a detent action mechanism to control rotation of the tuner control shaft through a predetermined angle step-by-step in equal steps, and a fine tuning mechanism to rotate the tuner control shaft finely at any detented position.

In the usual detent type UHF tuner, a tuner body is rotatably mounted on a suitable bearing and is rotated by a cam driving fine tuning mechanism to produce relative movement relative to the tuner control shaft. Such a mechanism is apt to require the tuner to have a rather large size and can sometimes produce a disturbance in the picture image of the television set due to vibrational noise, because a component having a large inertia is pivotally mounted so that the tuning frequency can be changed by vibration from outside the component.

BRIEF SUMMARY OF THE INVENTION

It is, therefore, an object of the present invention to provide an improved detent type tuning mechanism for a UHF tuner.

It is another object of the present invention to provide an improved detent type tuning mechanism for a UHF tuner which is not affected by vibration from outside.

It is a further object of the present invention to provide an improved detent type tuning mechanism for a UHF tuner which mechanism is compact in size and reliable in operation.

It is a still further object of the present invention to provide an improved detent type tuning mechanism for a UHF tuner wherein a tuner control shaft is rotated without backlash by a fine tuning mechanism including a novel differential gear means.

These objects of the present invention are achieved by a tuning mechanism for a UHF tuner having a tuner control shaft adjustable to tune the UHF tuner to any of the UHF television channels comprising:

channels comprising a tuning shaft mounted on said UHF tuner at a position generally coaxial with said tuner control shaft and rotatable step-by-step under the control of detent means; driving gear means mounted on said tuning shaft; driven gear means mounted on said tuner control shaft; a pair of planetary gear means rotatable as a single unit and meshing with said driving gear means and said driven gear means respectively; supporting means for supporting said pair of planetary gear means for free rotation around their own axes and for rotation around said driving gear means and said driven gear means; and fine tuning means coupled to said supporting means to swing said supporting means around said tuning shaft.

By this mechanism the tuner control shaft is rotated step-by-step by the rotation of said tuning shaft under the control of the detent means and through said driving gear means, said pair of planetary gear means, and said driven gear means, and said tuner control shaft is rotated finely and continuously by the rotation of said pair of planetary gear means on their own axes caused by the rotation of said pair of planetary gear means around said driving gear means and said driven gear means when said supporting means is swung about said tuning shaft by said fine tuning means while said tuning shaft is locked at any one of its detent stop positions by the detent means.

BRIEF DESCRIPTION OF THE DRAWINGS

The invention will become fully apparent from the following detailed description of one embodiment of the invention taken in conjunction with the accompanying drawings, in which.

DETAILED DESCRIPTION OF THE INVENTION

Figure 4:
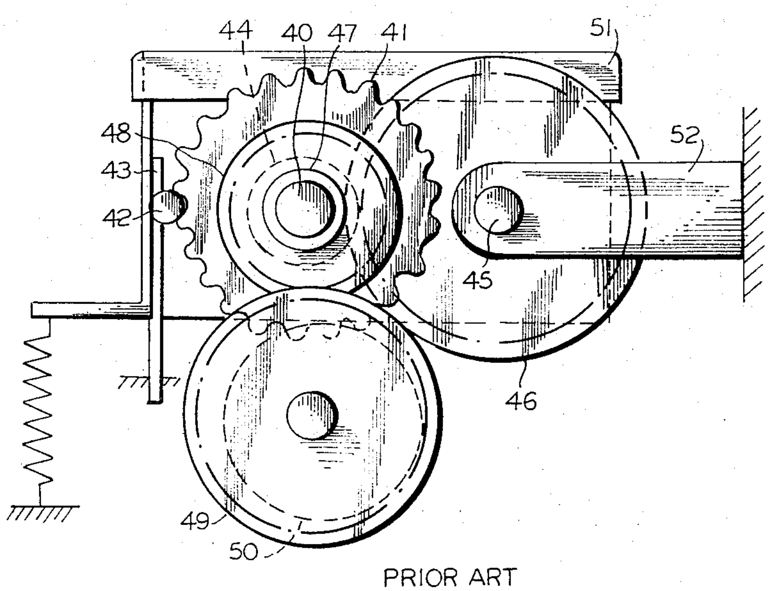
PRIOR ART FIG. 4
FIG. 4 is a schematic side view of the tuning mechanism for a conventional UHF detent action type tuner according to the prior art.

With reference to FIG. 4, the conventional detent type tuning mechanism for a UHF tuner includes a detent cam 41 having a plurality of equally divided recesses formed around the periphery thereof and which is fixed to a tuning shaft 40, a roller 42 engageable with said recesses of the detent cam 41, and a leaf spring 43 for biasing the roller 42 against the detent cam 41 to impart detenting action to the tuning shaft 40. Said tuning shaft 40 is provided with a driving gear 44 which meshes with a driven gear 46 fixed to a tuner control shaft 45. Said tuner control shaft 45 is rotated step-by-step through an angle corresponding to one channel in the UHF band through the driving gear 44 and the driven gear 46 by the rotation of the tuning shaft 40 under control of the detent means. By the rotation of a fine tuning shaft 47, a cam 50 is rotated through gears 48 and 49 to pivot a UHF tuner body 51 around the tuner control shaft 45 mounted on a bearing 52. This means that the tuner control shaft 45 rotates relative to the UHF tuner body 51. For such a detent action tuning mechanism, it is necessary to support the tuner body 51 pivotally on a suitable supporting device which makes the size of the whole tuner mechanism relatively large. In addition, disturbance can be easily produced in the picture image of the television set by virtue of the change in tuning frequency caused by vibration from outside, because the tuning mechanism is constructed in such a manner that components having a large inertia, such as the tuner body, are pivotally mounted.

Figure 1:
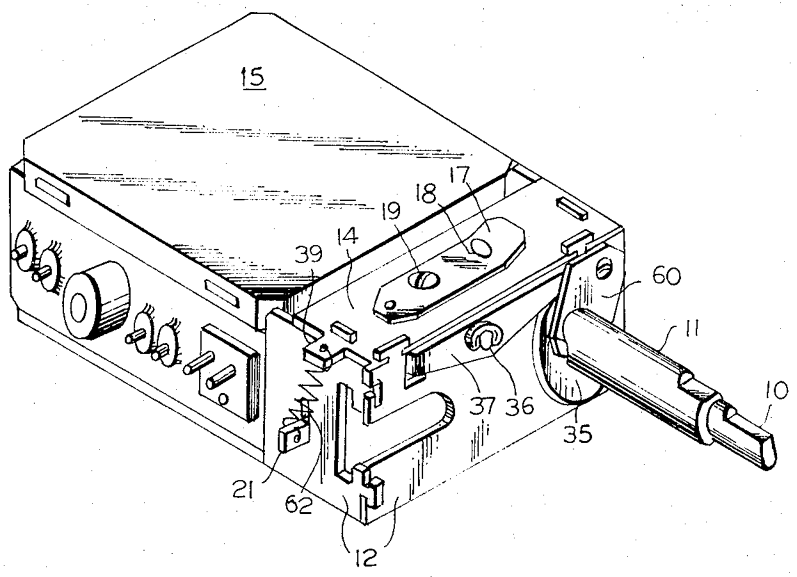
FIG. 1 is a perspective view of the tuning mechanism for a UHF tuner according to the present invention.
Figure 2:
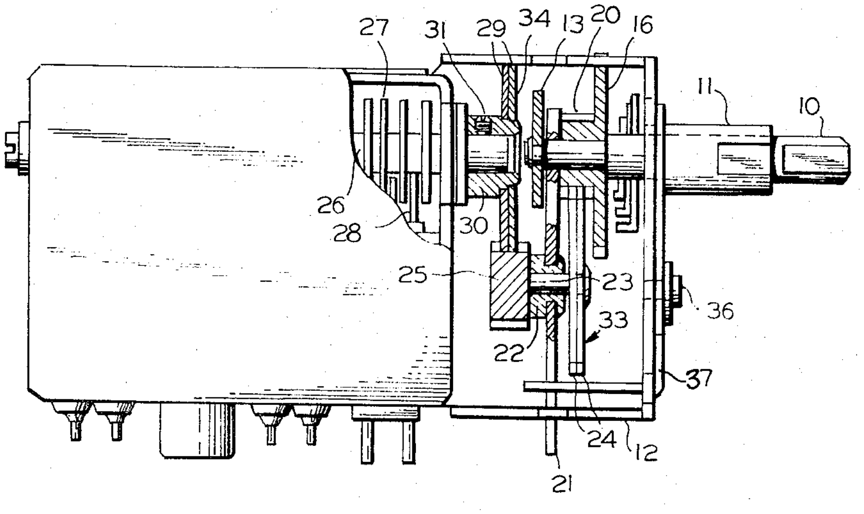
FIG. 2 is a plan view, partially in section, of the tuning mechanism of FIG. 1.
Figure 3:
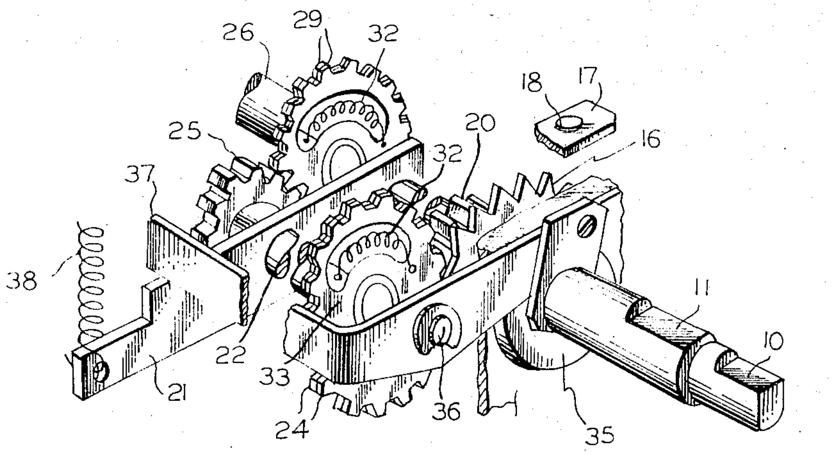
FIG. 3 is an expanded perspective view on an enlarged scale of the planetary gear means of the tuning mechanism according to the present invention.

Referring to FIGS. 1–3, one embodiment of the present invention will be described hereinafter.

A tuning shaft 10 is rotatably supported by a bracket 12 and a bearing plate 13 attached to the bracket 12.

Said tuning shaft 10 has a detent cam 16 and a driving gear 20 fixed thereto. The detent cam 16 has a plurality of equally divided recesses on the periphery thereof. A leaf spring 17 is affixed by a set screw 19 at one end thereof to an upper plate 14 which is permanently affixed to the bracket 12. The other end of said leaf spring 17 presses a steel ball 18 against the recesses of the detent cam 16 so as to restrict the rotation of the tuning shaft 10. A tubular fine tuning shaft 11 is rotatably mounted on and concentric with the tuning shaft 10. Said fine tuning shaft 11 has a fine tuning cam 35 affixed to one end thereof. One side surface of said fine tuning cam 35 is pressed against the bracket 12 by a leaf spring 60 so that the rotation of the fine tuning shaft 11 is restrained by the friction between the fine tuning cam 35 and the bracket 12. A pivotal lever 37 is pivotally mounted on a pin 36 fixed to the bracket 12. One end of the pivotal lever 37 is engaged with the peripheral surface of the fine tuning cam 35, and the other end of the pivotal lever 37 is bent and extends through a slot in bracket 12 and is engaged with the free end of a swinging lever 21. Said swinging lever 21 is pivotally mounted on the tuning shaft 10. The free end of the swinging lever 21 extends horizontally through an opening 62 in the bracket 12, and is biased upwards by a tension spring 38 connected thereto. The other end of said spring 38 is anchored to a tab 39 provided on the upper plate 14. The position of the end of the spring 38 anchored on the tab 39 is to the right in FIG. 2 relative to the end of the spring 38 anchored on the free end of the swinging lever 21. Therefore, the swinging lever 21 is biased not only clockwise when seen from the right side in FIG. 1, but also towards the right in FIG. 2.

The clockwise rotation of the swinging lever 21 is restricted in such a way that the swinging lever 21 drives the pivotal lever 37 to press said one end thereof against the peripheral surface of the fine tuning cam 35, the rotation of which is resisted by the leaf spring 60. The movement of the swinging lever 21 towards the right by the spring 38 is restricted by the opening 62 so that the swinging lever 21 is held perpendicular to the tuning shaft 10 as shown in FIG. 2.

When the fine tuning shaft 11 is rotated by an operator, the fine tuning cam 35 drives the pivotal lever 37 to swing the swinging lever 21 against biasing force of the spring 38, so that the rotation of the fine tuning shaft 11 is transmitted without lost motion into swinging motion of the swinging lever 21. The swinging lever 21 has a metal bearing 22 affixed to a middle portion thereof, and a shaft 23 is rotatably journalled in said metal bearing 22. A pair of planetary gear means are mounted on said shaft 23 as described hereinafter.

At one end of the shaft 23 is mounted a large planetary gear means 33 which is comprised of a pair of large gears 24 of the same size and a tension spring 32 connected between said gears 24, the gear means thus constituting split gears to prevent backlash. A small planetary gear 25 is fixed to the other end of the shaft 23 and is in mesh with a large driven gear means 34. Said large planetary gear means 33 is meshed with the driving gear 20 without backlash therebetween. The pitch diameters of the driving gear 20 and the large planetary gear means 33 are preferably the same as those of the small planetary gear 25 and the driven gear means 34 respectively. During the swinging motion of the swinging lever 21, the large planetary gear means 33 rotates on its own axis while rotating around the driving gear 20 since said gear 20 is subject to detent action by the pressing force of the leaf spring 17. At the same time, the small planetary gear 25 also rotates along with said large planetary gear means 33 since these gears are mounted on the shaft 23 and rotate as one body.

A UHF tuner body 15 which is a variable capacitance type, is fixed to a base portion of the bracket 12 by screws (not shown). Said UHF tuner body 15 is provided with a rotatable tuner control shaft 26 which has a plurality of rotor blades 27 affixed thereto. The UHF tuner body 15 has a plurality of stationary blades 28 mounted thereon, each of which is positioned side by side with one of the rotor blades 27 respectively.

The area of the rotor blades 27 and the stationary blades 28 opposing each other changes according to the rotation of the tuner control shaft 26, and the tuning frequency of the UHF tuner 15 changes in proportion to the angle of rotation of the tuner control shaft 26. The UHF tuner covers 70 television channels from No. 14 to No. 83 for 180° of rotation of the tuner control shaft 26. Therefore, the angle of rotation corresponding to one channel is a slight angle of about 2.6°. The driven gear means 34 is affixed to one end of the tuner control shaft 26 by a set screw 31 through a boss 30 thereof. Said driven gear means 34 comprises a pair of gears 29 of the same size and a tension spring 32 connected between said gears 29, the gear means thus constituting split gears to prevent backlash. Since the small planetary gear 25 is meshed with the driven gear means 34 without backlash, the tuning frequency can be finely adjusted by slight rotation of the small planetary gear 25.

In the detent type UHF tuner constructed as described above, the tuning shaft 10 can be independently rotated through one detent angle, i.e. the angle between two detent receiving recesses, until the steel ball 18 falls into the following recess in the detent cam 16 from the initial recess without driving the fine tuning shaft 11. During that time, the swinging lever 21 stands still, and rotation through one detent angle of the tuning shaft 10 is reduced by two steps through the driving gear 20, the large planetary gear means 33, the small planetary gear 25 and the driven gear means 34. Thus, the tuner control shaft 26 is stopped after rotation of 2.6° corresponding to one channel. Conversely speaking, this means that the rotation of the tuner control shaft 26 through 2.6° is enlarged by a couple of gear trains to a larger rotation angle of the tuning shaft 10. Therefore, it is possible to make the angle of rotation of the tuning shaft 10 between the recesses about the same angle of rotation of a tuning shaft in a conventional VHF tuner so that it is easy to operate and tune the UHF tuner.

These two parts of the gear train make possible a larger angle of rotation of the tuning shaft 10 under control of the detent means between the driving gear 20 and the large planetary gear means 33 and between the small planetary gear 25 and the driven gear means 34 so that the tuning mechanism can be made compact.

When the fine tuning shaft 11 is rotated without the rotation of the tuning shaft 10, the fine tuning cam 35 drives the pivotal lever 37 to swing the swinging lever 21 against biasing force of the spring 38. Since the detent cam 16 is held by the leaf spring 17 and the steel ball 18 at that time, the driving gear 20 can not rotate and the large planetary gear means 33 rotates around its own axis while rotating around the driving gear 20. Accordingly, the small planetary gear 25 rotates around its own axis while rotating around the driven gear means 34 so as to finely rotate the driven gear means 34 in a differential way.

Since each of the gear trains includes a gear assembly which has no backlash and consisting of a pair of gears of the same size and a tension spring connected therebetween respectively, such as the driven gear means 34 or the large planetary gear means 33, and since the rotation of the fine tuning shaft 11 is transmitted without lost motion to the swinging lever 21 through the pivotal lever 37 as described above, the transmission between the fine tuning shaft 11 and the tuner control shaft 26 can be achieved without backlash. Therefore, by the swinging motion of the swinging lever 21, the tuner control shaft 26 can be rotated continuously and independently of the tuning shaft 10 when shaft 10 is held in a rotational position under control of the detent means as described above.

Since it is sufficient for the tuner control shaft 26 to rotate through only a slight angle in the lower or higher frequency direction at in order to compensate for the fluctuation in the tuning frequency, it is unnecessary for the swinging lever to rotate a full rotation around the tuning shaft 10, and it is enough that it is able to swing slightly.

It is unnecessary to rotate the tuner body in the UHF tuner according to the present invention so that the structure of the tuning mechanism can be compact in size, strong enough to avoid vibration, and reliable in operation. In addition, the fine tuning shaft is mounted co-axially with the tuning shaft so that the fine tuning shaft can be easily operated.

Furthermore, the transmission between the fine tuning shaft 11 and the tuner control shaft 26 can be achieved without lost motion, so that tuning frequency of the UHF tuner can be easily and finely adjusted to the television broadcasting frequency.

It will be apparent to those skilled in the art that various modifications may be made without departing from the spirit of the invention. The above described specific example is intended merely to illustrate various facets in a certain selective embodiment of the invention;

What is claimed is:

1. A tuning mechanism for a UHF tuner having a tuner control shaft adjustable to tune the UHF tuner to any of the UHF television channels, said tuning mechanism comprising:

a tuning shaft rotatably mounted on said UHF tuner and detent means engaged with said tuning shaft for controlling rotation of the shaft in step-by-step rotation;

driving gear means mounted on said tuning shaft;

driven gear means mounted on said tuner control shaft;

a pair of planetary gear means rotatable as a single unit and meshing with said driving gear means and said driven gear means respectively;

supporting means for supporting said pair of planetary gear means for free rotation around their own axes and for rotation around said driven gear means and said driven gear means; and fine tuning means coupled to said supporting means to swing said supporting means around said tuning shaft;

whereby said tuner control shaft is rotated step-by-step by the step-by-step rotation of said tuning shaft through said driving gear means, said pair of planetary gear means, and said driven gear means, and said tuner control shaft is rotated finely and continuously by the rotation of said pair of planetary gear means on their own axis caused by the rotation of said pair of planetary gear means around said driving gear means and said driven gear means when said supporting means is swung around said tuning shaft by said fine tuning means while said tuning shaft is locked at any one of its stop positions by said detent means.

2. A tuning mechanism for a UHF tuner as claimed in claim 1 wherein said driving gear means has the same number of teeth as the one of said pair of planetary gear means meshing with said driven gear means, and said driven gear means has the same number of teeth as the other of said pair of planetary gear means meshing with said driving gear means, and the number of teeth on said driven gear means is larger than that on said driving gear means.

3. A tuning mechanism for a UHF tuner as claimed in claim 1 wherein said supporting means is a single swinging lever rotatably mounted on said tuning shaft and a shaft having the middle portion journalled on said lever and having said pair of planetary gear means fixed at the ends thereof.

4. A tuning mechanism for a UHF tuner as claimed in claim 3 further comprising a bracket supporting said tuning shaft and having an opening therein, the free end of said swinging lever being movable in said slot for guiding said lever rotatably around said driving gear and perpendicularly to said tuning shaft.

5. A tuning mechanism for a UHF tuner as claimed in claim 1 wherein said fine tuning means comprises a fine tuning shaft co-axially mounted on said tuning shaft, a fine tuning cam fixed to said fine tuning shaft, a frictional supporting means engaging said fine tuning cam for restraining the rotation of said fine tuning cam, a pivotal lever coupled to both said fine tuning cam and said supporting means, and a spring attached to said supporting means urging said supporting means against said pivotal lever and also urging said lever against said fine tuning cam, whereby said tuner control shaft is rotated slightly and continuously by the rotation of said pair of planetary gear means around their own axes upon the rotation of said pair of planetary gear means around said driving gear means and said driven gear means when said fine tuning shaft is rotated to swing said supporting means against the biasing force of said spring and the frictional force of said frictional supporting means through said fine tuning cam and said pivotal lever.

6. A tuning mechanism for a UHF tuner as claimed in claim 5 further comprising a bracket supporting said tuning shaft and having an opening therein, the free end of said swinging lever being movable in said slot for guiding said lever rotatably around said driving gear and perpendicularly to said tuning shaft.

* * * * *